(12) United States Patent
Shimomura et al.

(10) Patent No.: US 12,381,155 B2
(45) Date of Patent: Aug. 5, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Saya Shimomura, Ishikawa (JP); Hiroaki Katou, Ishikawa (JP); Yasuhiro Kawai, Ishikawa (JP); Hiroshi Yoshida, Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 447 days.

(21) Appl. No.: 17/864,132

(22) Filed: Jul. 13, 2022

(65) Prior Publication Data
US 2023/0260917 A1    Aug. 17, 2023

(30) Foreign Application Priority Data

Feb. 15, 2022   (JP) ................. 2022-021444

(51) Int. Cl.
*H10D 62/17*   (2025.01)
*H01L 23/522*   (2006.01)
(Continued)

(52) U.S. Cl.
CPC ........ *H01L 23/5386* (2013.01); *H01L 23/522* (2013.01); *H10D 62/393* (2025.01);
(Continued)

(58) Field of Classification Search
CPC .. H10D 30/0297; H10D 30/66; H10D 30/662; H10D 62/405; H10D 64/20; H10D 64/117; H10D 64/256
(Continued)

(56) References Cited

U.S. PATENT DOCUMENTS

| 10,453,930 B2 | 10/2019 | Nishiguchi |
| 11,133,411 B2 | 9/2021 | Nishiwaki |

(Continued)

FOREIGN PATENT DOCUMENTS

| JP | 2018-182258 A | 11/2018 |
| JP | 2019054071 A | 4/2019 |

(Continued)

OTHER PUBLICATIONS

Sang-Gi Kim, et al., "Trench Corner Rounding Technology Using Hydrogen Annealing for Highly Reliable Trench DMOSFETs," Proceedings of the 12th International Symposium on Power Semiconductor Devices & ICs., IPSD '2000 (IEEE Cat. No. 00CH37094C), 2000, pp. 87-90, 4 pages.

(Continued)

*Primary Examiner* — Fazli Erdem
(74) *Attorney, Agent, or Firm* — Kim & Stewart LLP

(57) ABSTRACT

According to one embodiment, a semiconductor device includes first and second electrodes, first to third semiconductor regions, a conductive body, and a gate electrode. The first semiconductor region is located on the first electrode and electrically connected with the first electrode. The second semiconductor region is located on the first semiconductor region. The third semiconductor region is located on a portion of the second semiconductor region. The conductive body is located in the first semiconductor region with an insulating part interposed. A lower surface of the conductive body includes first and second surfaces. The gate electrode is located in the insulating part. The gate electrode faces the second semiconductor region via a gate insulating layer. The second electrode is located on the second and third semiconductor regions. The second electrode is electrically connected with the second and third semiconductor regions.

19 Claims, 9 Drawing Sheets

(51) Int. Cl.
  *H01L 23/538* (2006.01)
  *H10D 30/66* (2025.01)
  *H10D 64/27* (2025.01)
(52) U.S. Cl.
  CPC ......... *H10D 64/513* (2025.01); *H10D 64/514* (2025.01); *H10D 64/517* (2025.01); *H10D 30/66* (2025.01)
(58) Field of Classification Search
  USPC ....................................................... 257/288
  See application file for complete search history.

(56) References Cited

U.S. PATENT DOCUMENTS

| | | | |
|---|---|---|---|
| 2007/0145416 A1* | 6/2007 | Ohta | H01L 29/42372 257/213 |
| 2013/0069150 A1* | 3/2013 | Matsuoka | H01L 29/41741 438/270 |
| 2013/0153995 A1* | 6/2013 | Misawa | H01L 29/66734 438/270 |
| 2016/0172451 A1 | 6/2016 | Igel-Holtzendorff et al. | |
| 2017/0263767 A1 | 9/2017 | Nishiwaki | |
| 2019/0081173 A1 | 3/2019 | Nishiwaki et al. | |
| 2019/0305092 A1 | 10/2019 | Blank et al. | |
| 2020/0243656 A1* | 7/2020 | Shibib | H01L 29/404 |
| 2021/0028289 A1 | 1/2021 | Fang et al. | |
| 2021/0202704 A1 | 7/2021 | Kishimoto et al. | |
| 2021/0296490 A1 | 9/2021 | Shiraishi et al. | |
| 2021/0320178 A1 | 10/2021 | Hossain et al. | |

FOREIGN PATENT DOCUMENTS

| | | |
|---|---|---|
| JP | 2019-140152 A | 8/2019 |
| JP | 2021-034543 A | 3/2021 |
| JP | 2021-108322 A | 7/2021 |
| JP | 2021-150536 A | 9/2021 |

OTHER PUBLICATIONS

Jongdae Kim, et al., "A Novel Process Technique for Fabricating High Reliable Trench DMOSFETs using Self-Align Technique and Hydrogen Annealing," Proceedings of the 13th International Symposium on Power Semiconductor Devices & ICs., Osaka, IPSD '01 (IEEE Cat. No. 01CH37216), 2001, pp. 139-142, 4 pages.

Notice of Reasons for Refusal (Office Action) dated Feb. 20, 2025 in corresponding Japanese Patent Application No. 2022-021444 with English machine translation (12 pages).

* cited by examiner

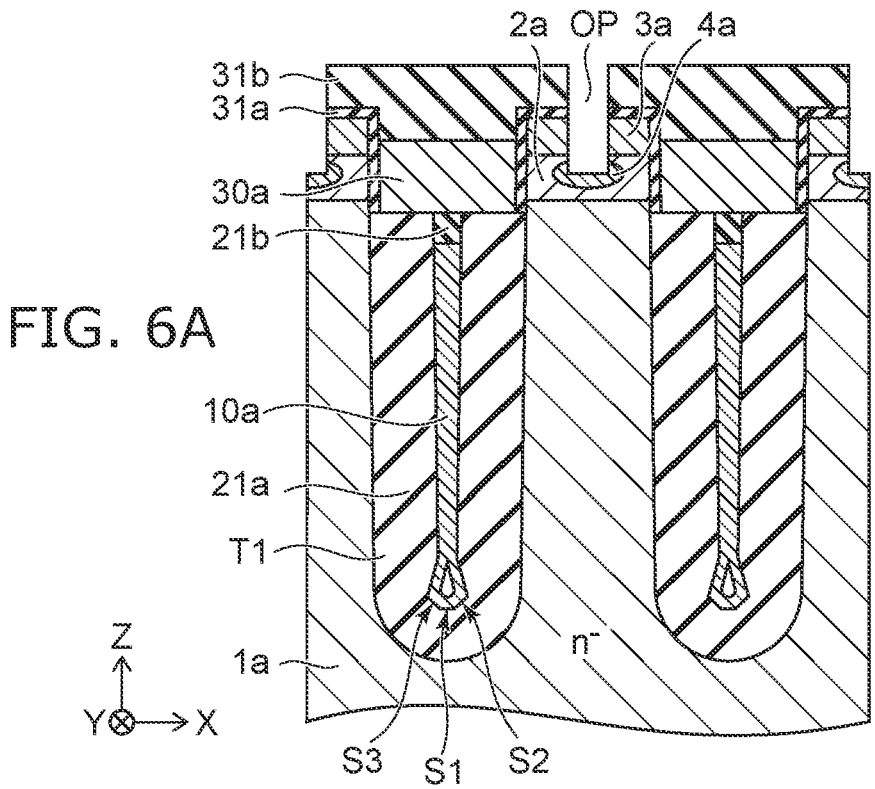
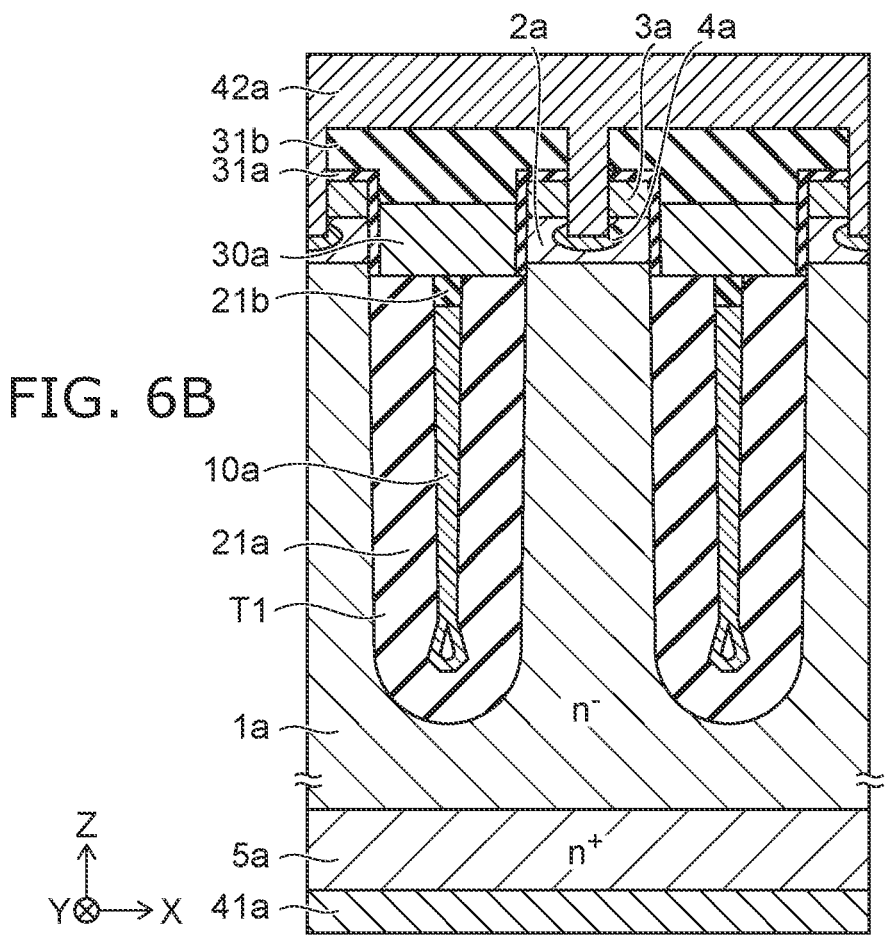

SEMICONDUCTOR DEVICE

CROSS-REFERENCE TO RELATED APPLICATIONS

This application is based upon and claims the benefit of priority from Japanese Patent Application No. 2022-021444, filed on Febr. 15, 2022; the entire contents of which are incorporated herein by reference.

FIELD

Embodiments described herein relate generally to a semiconductor device.

BACKGROUND

Semiconductor devices such as metal oxide semiconductor field effect transistors (MOSFETs) and the like are used in, for example, power conversion. It is desirable to reduce the leakage current of semiconductor devices.

BRIEF DESCRIPTION OF THE DRAWINGS

FIGS. 6A and 6B are cross-sectional views showing a method for manufacturing the semiconductor device according to the embodiment;

DETAILED DESCRIPTION

Figure 1:
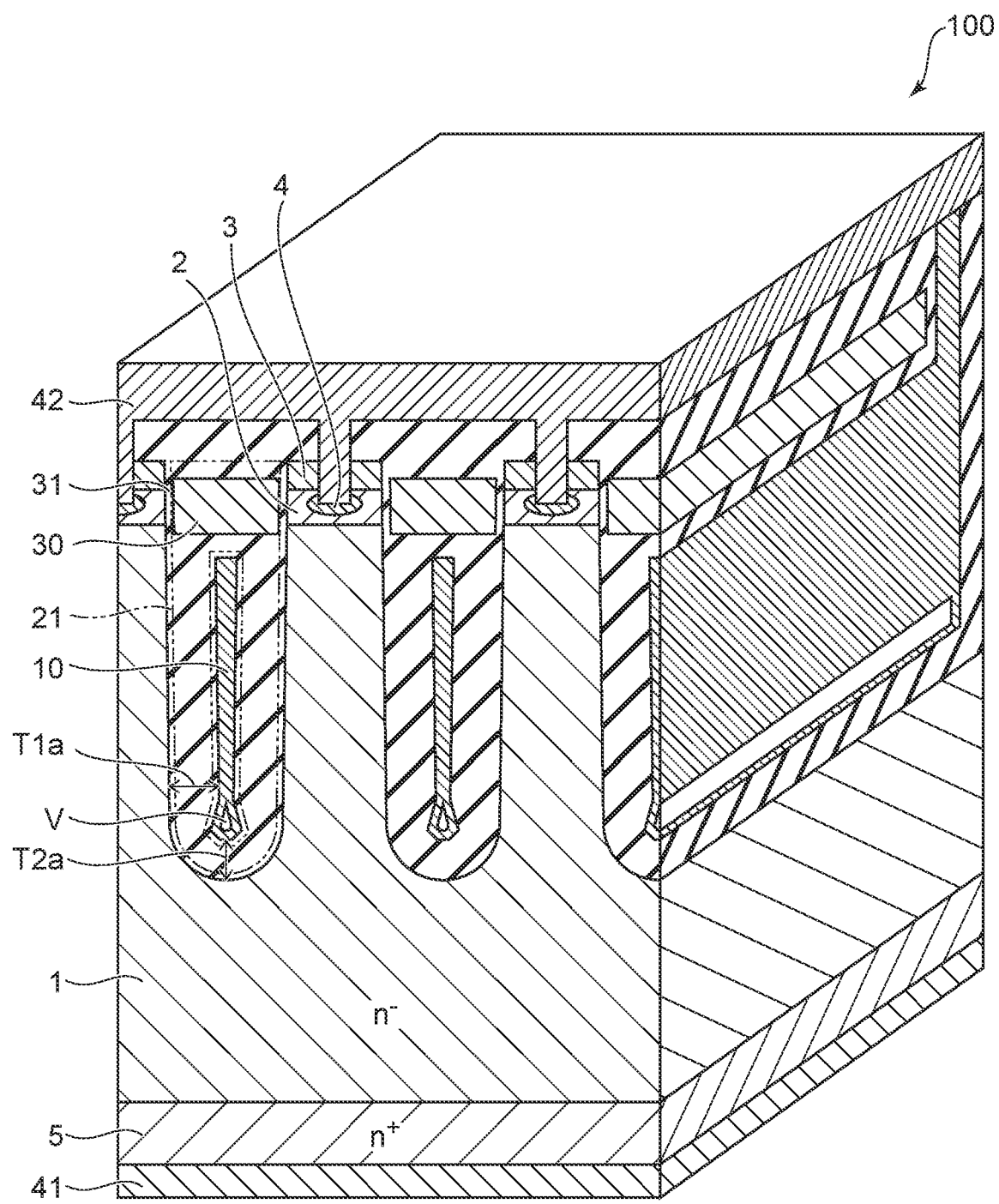
FIG. 1 is a perspective cross-sectional view showing a portion of a semiconductor device according to an embodiment.

According to one embodiment, a semiconductor device includes a first electrode, a first semiconductor region of a first conductivity type, a second semiconductor region of a second conductivity type, a third semiconductor region of the first conductivity type, a conductive body, a gate electrode, and a second electrode. The first semiconductor region is located on the first electrode and electrically connected with the first electrode. The second semiconductor region is located on the first semiconductor region. The third semiconductor region is located on a portion of the second semiconductor region. The conductive body is located in the first semiconductor region with an insulating part interposed. A lower surface of the conductive body includes a first surface and a second surface. The first surface is parallel to a second direction orthogonal to a first direction. The first direction is from the first electrode toward the first semiconductor region. The second surface is linked to the first surface. The second surface is oblique to the first and second directions. The gate electrode is located in the insulating part. The gate electrode faces the second semiconductor region via a gate insulating layer in the second direction. The second electrode is located on the second and third semiconductor regions. The second electrode is electrically connected with the second and third semiconductor regions.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

FIG. 1 is a perspective cross-sectional view showing a portion of a semiconductor device according to an embodiment.

As shown in FIG. 1, the semiconductor device 100 according to the embodiment includes an $n^-$-type (first-conductivity-type) drift region 1 (a first semiconductor region), a p-type (second-conductivity-type) base region 2 (a second semiconductor region), an $n^+$-type source region 3 (a third semiconductor region), a $p^+$-type contact region 4, an $n^+$-type drain region 5, a conductive body 10, an insulating part 21, a gate electrode 30, a drain electrode 41 (a first electrode), and a source electrode 42 (a second electrode). The semiconductor device 100 is, for example, a MOSFET.

An XYZ orthogonal coordinate system is used in the description of the embodiments. The direction from the drain electrode 41 toward the $n^-$-type drift region 1 is taken as a Z-direction (a first direction). One direction orthogonal to the Z-direction is taken as an X-direction (a second direction). A direction orthogonal to the X-direction and the Z-direction is taken as a Y-direction. Herein, the direction from the drain electrode 41 toward the $n^-$-type drift region 1 is called "up", and the opposite direction is called "down". These directions are based on the relative positional relationship between the drain electrode 41 and the $n^-$-type drift region 1 and are independent of the direction of gravity.

The drain electrode 41 is located at the lower surface of the semiconductor device 100. The $n^+$-type drain region 5 is located on the drain electrode 41 and is electrically connected with the drain electrode 41. The $n^-$-type drift region 1 is located on the n⁺-type drain region 5. The n-type impurity concentration in the n⁻-type drift region 1 is less than the n-type impurity concentration in the n⁺-type drain region 5. The n⁻-type drift region 1 is electrically connected with the drain electrode 41 via the n⁺-type drain region 5.

The p-type base region 2 is located on the n⁻-type drift region 1. The n⁺-type source region 3 is located on a portion of the p-type base region 2. The p⁺-type contact region 4 is located on the other portion of the p-type base region 2. The p-type impurity concentration in the p⁺-type contact region 4 is greater than the p-type impurity concentration in the p-type base region 2.

The conductive body 10 is located in the n⁻-type drift region 1 with the insulating part 21 interposed. The gate electrode 30 is located in the insulating part 21 and is positioned on the conductive body 10. The gate electrode 30 is located in the insulating part 21 and faces the p-type base region 2 via a gate insulating layer 31 in the X-direction. The gate insulating layer 31 is a portion of the insulating part 21. In the illustrated example, the gate electrode 30 faces both a portion of the n⁻-type drift region 1 and a portion of the n⁺-type source region 3.

The source electrode 42 is located on the n⁺-type source region 3 and the p⁺-type contact region 4 and is electrically connected with the n⁺-type source region 3 and the p⁺-type contact region 4. In the illustrated example, a portion of the source electrode 42 extends downward and is located between a pair of n⁺-type source regions 3 arranged in the X-direction. The p-type base region 2 is electrically connected with the source electrode 42 via the p⁺-type contact region 4. The gate electrode 30 is electrically isolated from the source electrode 42 by the gate insulating layer 31.

Pluralities of each of the p-type base regions 2, the n⁻-type source regions 3, the p⁺-type contact regions 4, the conductive bodies 10, and the gate electrodes 30 are arranged in the X-direction and extend in the Y-direction. The Y-direction end portion of the conductive body 10 is drawn upward and electrically connected with the source electrode 42. Or, the insulating part 21 may not be located between the conductive body 10 and the gate electrode 30; and the conductive body 10 may be electrically connected with the gate electrode 30.

Figure 2:
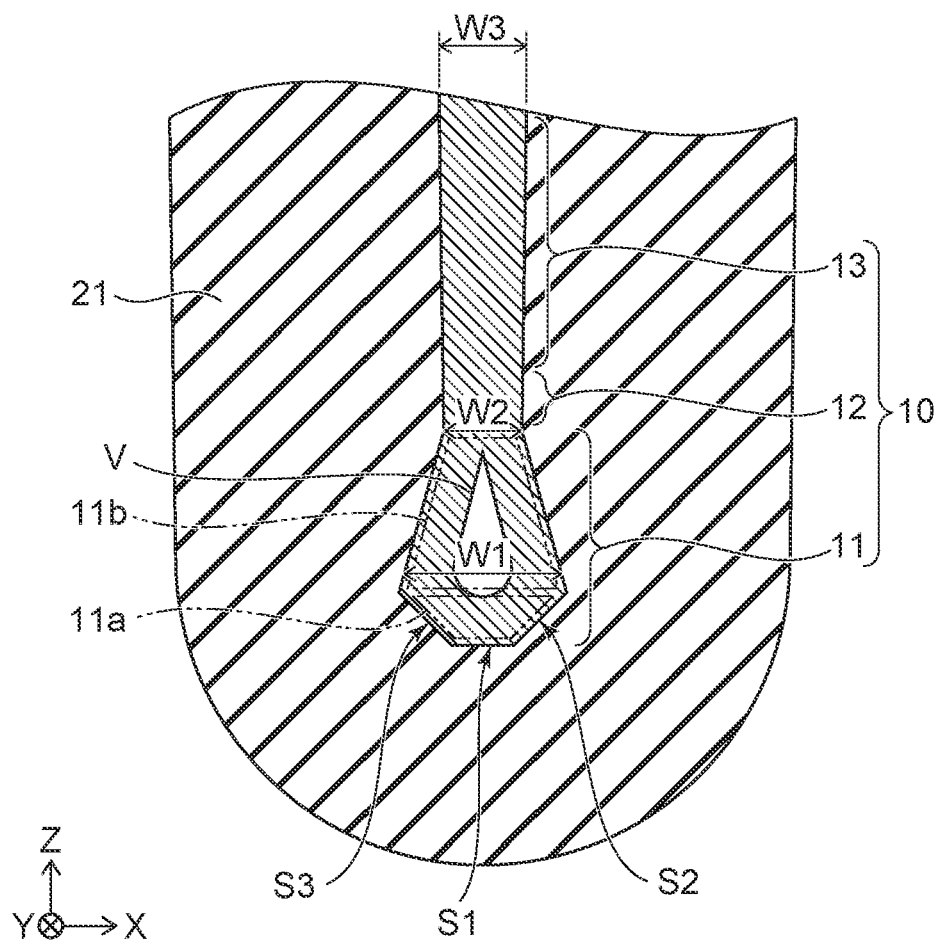
FIG. 2 is an enlarged cross-sectional view of a portion of FIG. 1.

FIG. 2 is an enlarged cross-sectional view of a portion of FIG. 1.

As shown in FIG. 2, the lower surface of the conductive body 10 includes a first surface S1, a second surface S2, and a third surface S3. The first surface S1 is parallel to the X-Y plane. The second surface S2 and the third surface S3 are linked to the first surface S1 and are oblique to the X-direction and the Z-direction. The X-direction position of the first surface S1 is between the X-direction position of the second surface S2 and the X-direction position of the third surface S3.

More specifically, the conductive body 10 includes a first conductive part 11, a second conductive part 12, and a third conductive part 13. The first conductive part 11 is positioned at the lower end of the conductive body 10. The second conductive part 12 is located on the first conductive part 11. The third conductive part 13 is located on the second conductive part 12.

The first conductive part 11 includes the first to third surfaces S1 to S3. A width W1 (the length in the X-direction) of the first conductive part 11 is greater than a width W2 of the second conductive part 12. The width W2 of the second conductive part 12 is less than a width W3 of the third conductive part 13. The width W2 of the second conductive part 12 may be equal to the width W3 of the third conductive part 13.

The first conductive part 11 includes a first portion 11a and a second portion 11b. The first portion 11a includes the first to third surfaces S1 to S3. The second portion 11b is located on the first portion 11a. The width of the first portion 11a increases upward. The width of the second portion 11b decreases upward. For example, the length in the Z-direction of the first portion 11a is less than the length in the Z-direction of the second portion 11b.

As illustrated, a void V may be provided in the first conductive part 11. The void V that is provided in the first conductive part 11 extends in the Y-direction. Or, multiple voids V may be interspersed along the Y-direction.

Operations of the semiconductor device 100 will now be described.

A voltage that is not less than a threshold is applied to the gate electrode 30 in a state in which a positive voltage with respect to the source electrode 42 is applied to the drain electrode 41. Thereby, a channel (an inversion layer) is formed in the p-type base region 2; and the semiconductor device 100 is set to the on-state. Electrons flow from the source electrode 42 toward the drain electrode 41 via the channel. When the voltage applied to the gate electrode 30 drops below the threshold, the channel of the p-type base region 2 disappears, and the semiconductor device 100 switches to the off-state.

When the semiconductor device 100 switches to the off-state, the positive voltage that is applied to the drain electrode 41 increases with respect to the source electrode 42. At this time, a depletion layer spreads toward the n⁻-type drift region 1 from the interface between the insulating part 21 and the n⁻-type drift region 1 due to the potential difference between the drain electrode 41 and the source electrode 42 or the potential difference between the drain electrode 41 and the gate electrode 30. The breakdown voltage of the semiconductor device 100 can be increased by the spreading of the depletion layer. Or, the n-type impurity concentration in the n⁻-type drift region 1 can be increased and the on-resistance of the semiconductor device 100 can be reduced while maintaining the breakdown voltage of the semiconductor device 100.

Examples of the materials of the components of the semiconductor device 100 will now be described.

The n⁻-type drift region 1, the p-type base region 2, the n⁺-type source region 3, the p⁺-type contact region 4, and the n⁺-type drain region 5 include a semiconductor material. Silicon, silicon carbide, gallium nitride, or gallium arsenide can be used as the semiconductor material. When silicon is used as the semiconductor material, arsenic, phosphorus, or antimony can be used as the n-type impurity. Boron can be used as the p-type impurity.

The insulating part 21 includes an insulating material. For example, the insulating part 21 includes silicon oxide, silicon nitride, or silicon oxynitride. The conductive body 10 and the gate electrode 30 include a conductive material such as polysilicon, etc. An n-type or a p-type impurity may be added to the conductive body 10 and the gate electrode 30. The drain electrode 41 and the source electrode 42 include a metal such as titanium, tungsten, aluminum, etc.

FIGS. 3A to 6B are cross-sectional views showing a method for manufacturing the semiconductor device according to the embodiment.

Figure 3A:
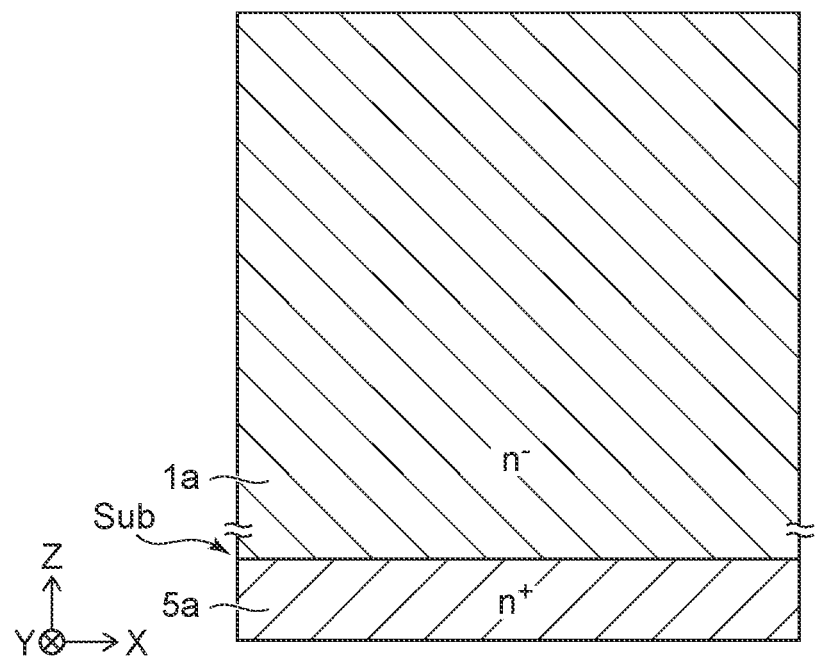
FIGS. 3A and 3B are cross-sectional views showing a method for manufacturing the semiconductor device according to the embodiment.

An example of the method for manufacturing the semiconductor device 100 according to the embodiment will now be described with reference to FIGS. 3A to 6B. First, a semiconductor substrate Sub that includes an n$^+$-type semiconductor layer 5a is prepared. As shown in FIG. 3A, an n$^-$-type semiconductor layer 1a is formed by epitaxially growing silicon on the n$^+$-type semiconductor layer 5a.

Figure 3B:
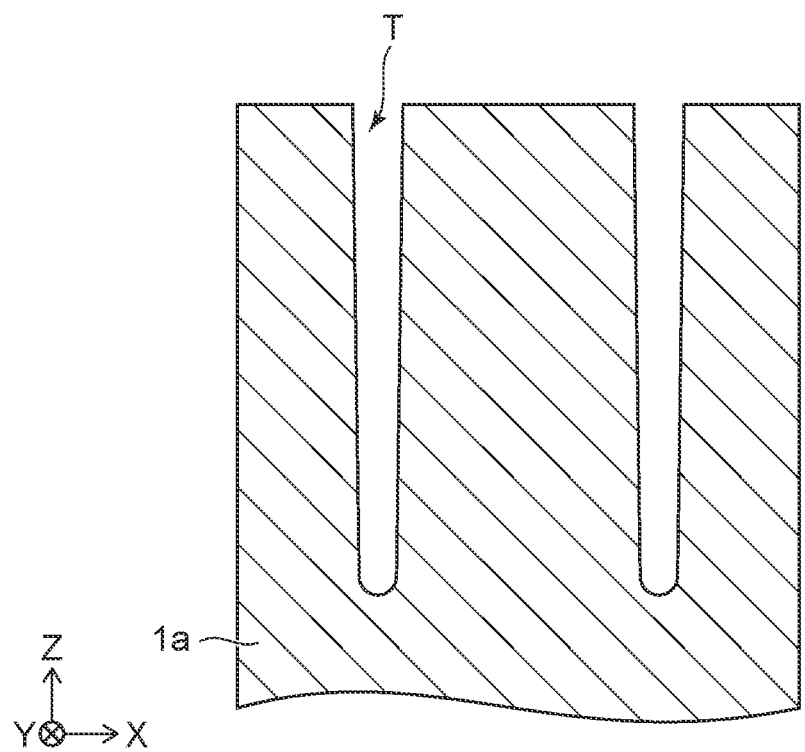

As shown in FIG. 3B, multiple trenches T1 are formed in the upper surface of the n$^-$-type semiconductor layer 1a by photolithography and reactive ion etching (RIE). When performing RIE, a mildly anisotropic etching gas is used. The lower surfaces of the trenches T1 can be curved thereby. A {100} plane, a {110} plane, or the like of silicon appears at the curved surfaces. Sulfur hexafluoride (SF$_6$) can be used as the etching gas.

Figure 4A:
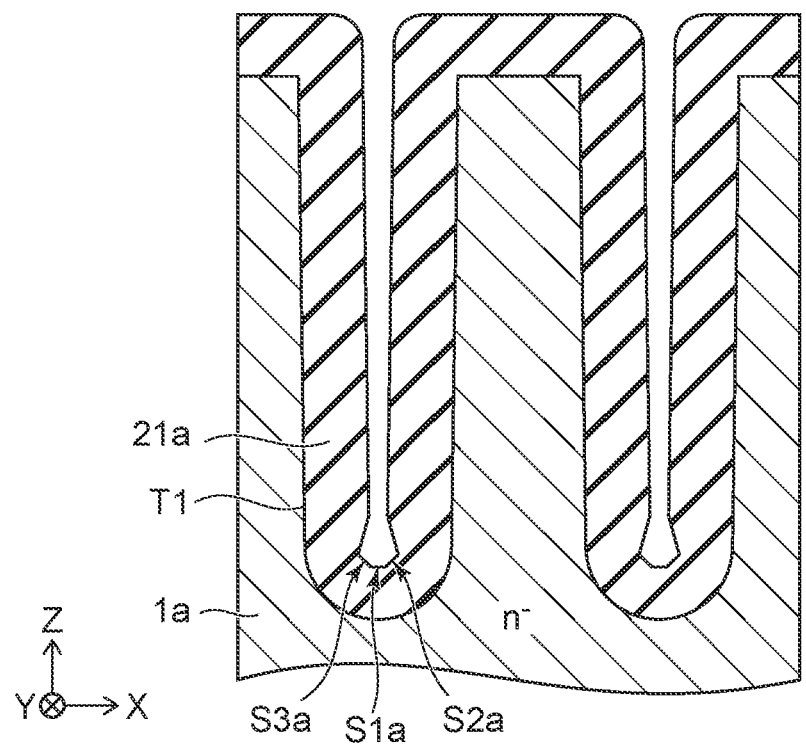
FIGS. 4A and 4B are cross-sectional views showing a method for manufacturing the semiconductor device according to the embodiment.

As shown in FIG. 4A, an insulating layer 21a is formed along the upper surface of the n$^-$-type semiconductor layer 1a and the inner surfaces of the trenches T1. The insulating layer 21a is formed by thermal oxidation. At this time, oxidization progresses along the [100] direction and the [110] direction of silicon. Thereby, a flat surface S1a, an oblique surface S2a, and an oblique surface S3a are formed at the lower surface of each trench T2 surrounded with the insulating layer 21a. A {100} plane of silicon oxide appears at the flat surface S1a. A {110} plane of silicon oxide appears at the oblique surfaces S2a and S3a. When forming the insulating layer 21a, the bottom portion of the trench T2 becomes wider than the upper portion. As described below, it is considered that this is an effect of stress in the thermal oxidation.

For silicon and silicon oxide, the {100} plane means any of the equivalent (100) plane, (010) plane, or (001) plane. The {110} plane means any of the equivalent (110) plane, (011) plane, or (101) plane.

Figure 4B:
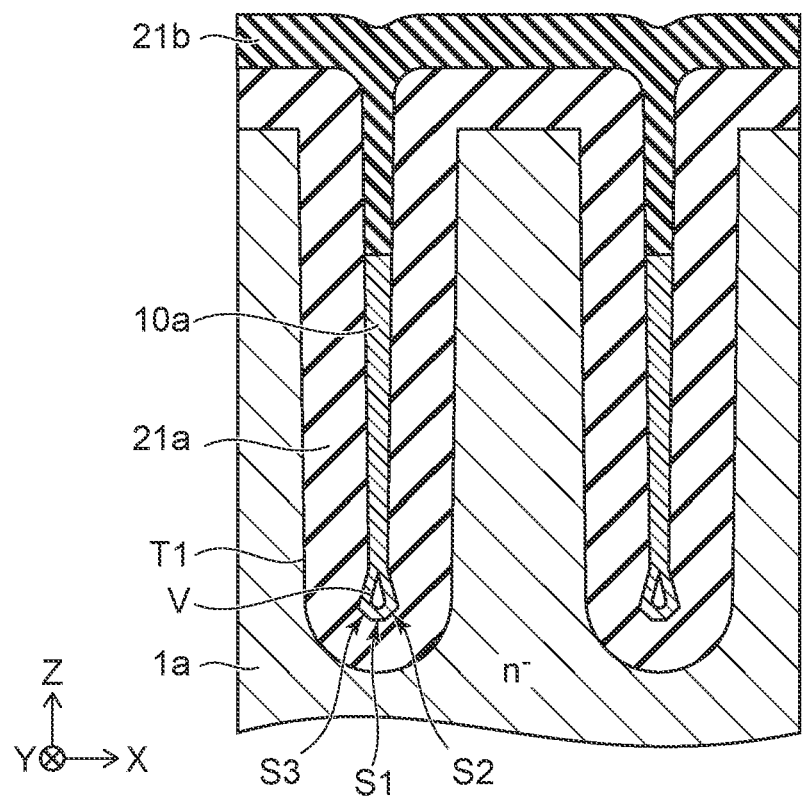

A conductive layer 10a that fills the trenches T2 is formed on the insulating layer 21a. The conductive layer 10a is formed by chemical vapor deposition (CVD) of a conductive material such as polysilicon, etc. When forming the conductive layer 10a, the void V is formed at the bottom portion of the trench T2. The upper surface of the conductive layer 10a is caused to recede by removing a portion of the conductive layer 10a by chemical dry etching (CDE), etc. Thereby, the separated multiple conductive layers 10a are formed respectively in the multiple trenches T2. As shown in FIG. 4B, an insulating layer 21b is formed by CVD on the insulating layer 21a and the multiple conductive layers 10a. The conductive layer 10a includes the first surface S1 contacting the flat surface S1a. The conductive layer 10a also includes the second surface S2 and the third surface S3 respectively contacting the oblique surfaces S2a and S3a.

Figure 5A:
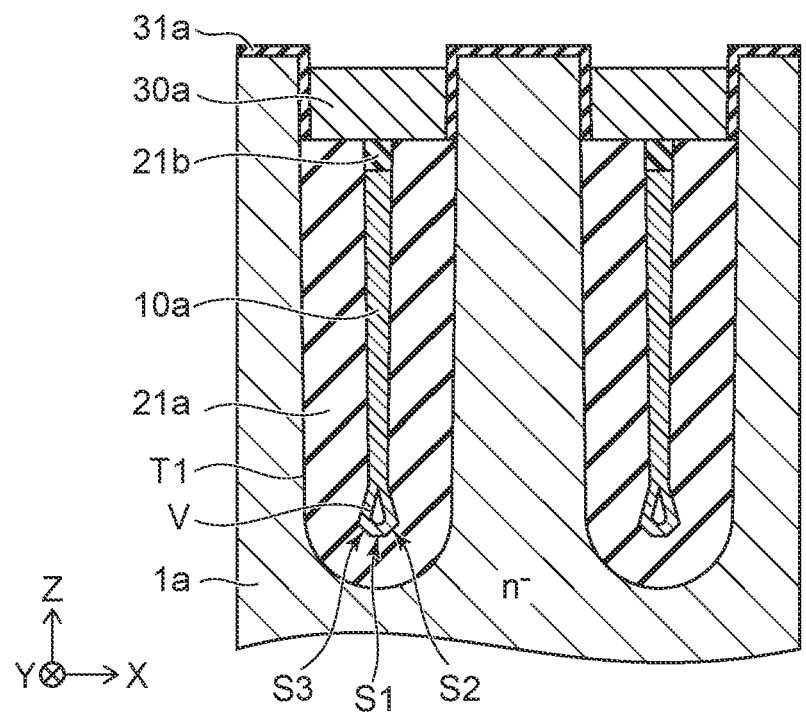
FIGS. 5A and 5B are cross-sectional views showing a method for manufacturing the semiconductor device according to the embodiment.

The upper surface of the insulating layer 21a and the upper surface of the insulating layer 21b are caused to recede by wet etching. The upper surface of the n$^-$-type semiconductor layer 1a and portions of the side surfaces of the trenches T1 are exposed thereby. An insulating layer 31a is formed by thermal oxidation on the upper surface of the n$^-$-type semiconductor layer 1a and the side surfaces of the trenches T1 that are exposed. The thickness of the insulating layer 31a is less than the thickness of the insulating layer 21a. A conductive layer 30a is formed on the insulating layer 31a. As shown in FIG. 5A, the conductive layer 30a is formed inside each trench T1 by causing the upper surface of the conductive layer 30a to recede by CDE or wet etching.

Figure 5B:
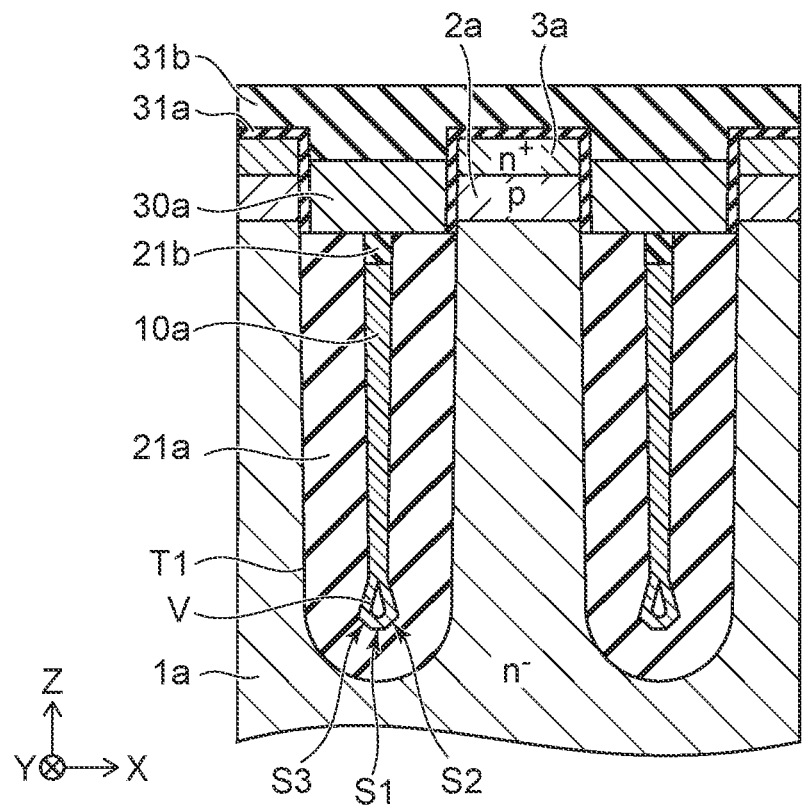

A p-type semiconductor region 2a and an n$^+$-type semiconductor region 3a are formed by sequentially ion-implanting a p-type impurity and an n-type impurity into the upper portion of the n$^-$-type semiconductor layer 1a between the trenches T1. As shown in FIG. 5B, an insulating layer 31b that covers the multiple conductive layers 30a is formed.

Openings OP that extend through the insulating layer 31b, the insulating layer 31a, and the n$^+$-type semiconductor region 3a and reach the p-type semiconductor region 2a are formed. As shown in FIG. 6A, p$^+$-type semiconductor regions 4a are formed by ion-implanting a p-type impurity into the p-type semiconductor region 2a via the openings OP.

A metal layer 42a that fills the openings OP is formed on the insulating layer 31b. Subsequently, the lower surface of the semiconductor substrate Sub is polished until the n$^+$-type semiconductor layer 5a has a prescribed thickness. A metal layer 41a is formed on the polished lower surface as shown in FIG. 6B. The semiconductor device 100 shown in FIG. 1 is manufactured by the processes described above.

The n$^-$-type semiconductor layer 1a shown in FIG. 6B corresponds to the n$^-$-type drift region 1 shown in FIG. 1. The p-type semiconductor region 2a corresponds to the p-type base region 2. The n$^+$-type semiconductor region 3a corresponds to the n$^+$-type source region 3. The p$^+$-type semiconductor region 4a corresponds to the p$^+$-type contact region 4. The n$^+$-type semiconductor layer 5a corresponds to the n$^+$-type drain region 5. The conductive layer 10a corresponds to the conductive body 10. The insulating layers 21a and 21a correspond to the insulating part 21. The conductive layer 30a correspond to the gate electrode 30. The insulating layers 31a and 31b correspond to the gate insulating layer 31. The metal layer 41a corresponds to the drain electrode 41. The metal layer 42a corresponds to the source electrode 42.

Advantages of the semiconductor device according to the embodiment will now be described.

Figure 7:
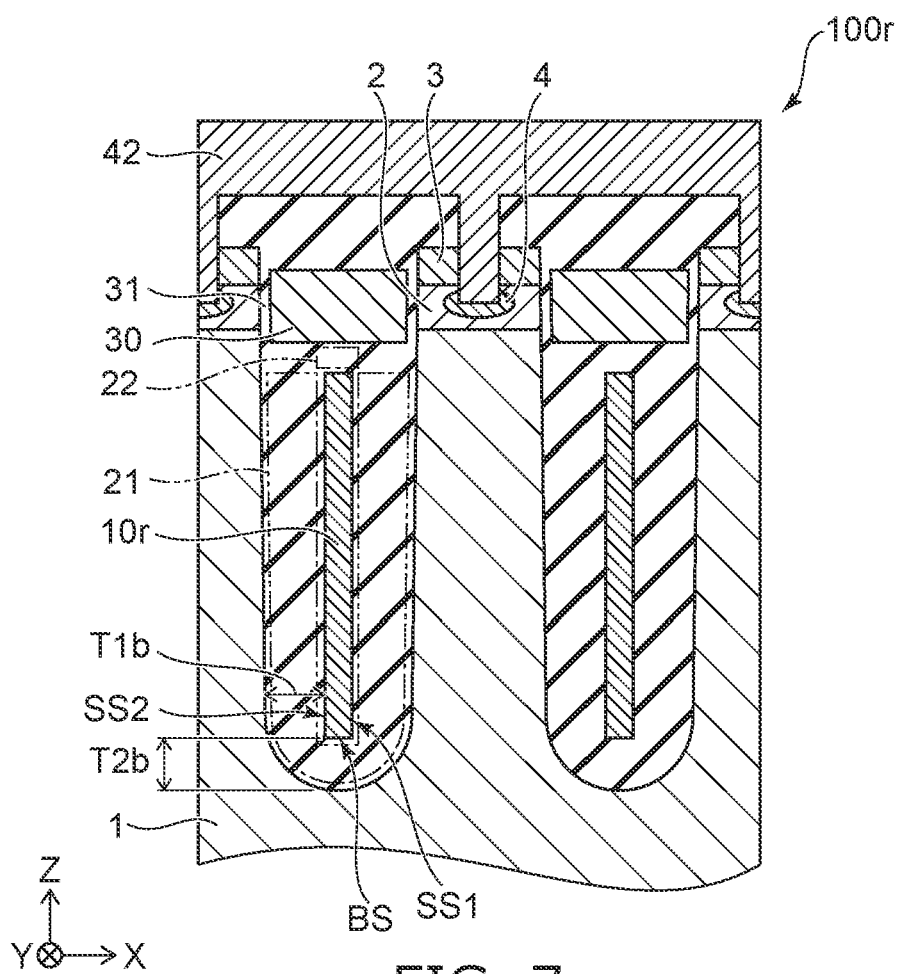
FIG. 7 is a cross-sectional view showing a portion of a semiconductor device according to a reference example.

FIG. 7 is a cross-sectional view showing a portion of a semiconductor device according to a reference example.

In the semiconductor device 100r shown in FIG. 7, a conductive body 10r includes a bottom surface BS, a side surface SS1, and a side surface SS2. The bottom surface BS is parallel to the X-Y plane. The side surfaces SS1 and SS2 are parallel to the Y-Z plane. Therefore, the corner between the bottom surface BS and the side surface SS1 and the corner between the bottom surface BS and the side surface SS2 are right angles.

When the semiconductor device 100r is in the off-state, an electric field is generated between the n$^-$-type drift region 1 and the conductive body 10r by the potential difference between the drain electrode 41 and the source electrode 42. At this time, electric field concentration occurs at the corners of the lower end of the conductive body 10r. A large electric field causes a leakage current to flow in the insulating part 21.

Figure 8:
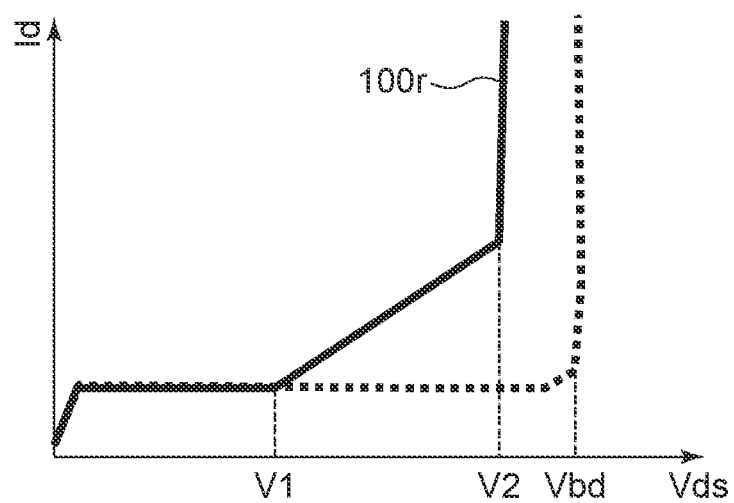
FIG. 8 is a graph schematically showing characteristics of the semiconductor devices.

FIG. 8 is a graph schematically showing characteristics of the semiconductor devices.

In FIG. 8, the horizontal axis is a voltage Vds of the drain electrode 41 with respect to the source electrode 42. The vertical axis is a current Id flowing between the drain electrode 41 and the source electrode 42. The solid line shows the characteristic of the semiconductor device according to the reference example. The broken line shows the characteristic of a desirable semiconductor device.

In the desirable semiconductor device, the current Id is small until the voltage reaches a breakdown voltage Vbd. The current Id abruptly increases when the voltage reaches the breakdown voltage Vbd. On the other hand, in the semiconductor device 100r according to the reference example, the current Id starts to increase at a voltage V1. The voltage V1 is less than the breakdown voltage Vbd. This is caused by a leakage current flowing through the insulating part 21. Also, when the voltage Vds further increases and reaches a voltage V2, the current Id abruptly increases. This is caused by avalanche breakdown occurring from a starting point at a portion inside the insulating part 21 at which the electric field strength is high. As shown in FIG. 8, due to the leakage current flowing through the insulating part 21, the substantial breakdown voltage of the semiconductor device 100 is reduced from the original breakdown voltage Vbd to the voltage V2.

For this problem, in the semiconductor device 100 according to the embodiment, the lower surface of the conductive body 10 includes the first surface S1 and the second surface S2. The first surface S1 is parallel to the X-direction. The second surface S2 that is linked to the first surface S1 is oblique to the X-direction and the Z-direction. Therefore, the angle between the first surface S1 and the second surface S2 is less than 90 degrees. Compared to the semiconductor device 100r, the electric field strength at the lower end vicinity of the conductive body 10 can be reduced thereby. As a result, the leakage current that flows in the insulating part 21 can be suppressed, and the breakdown voltage of the semiconductor device 100 can be increased.

When the angle between the first surface S1 and the second surface S2 is large, the effect of reducing the electric field strength is weakened. On the other hand, when the angle is small, the width of the lower end of the conductive body 10 lengthens. As a result, it is difficult to make the conductive body 10, the insulating part 21, and the like fine, and the on-resistance of the semiconductor device 100 may increase. It is therefore favorable for the angle to be greater than 30 degrees and less than 60 degrees.

Also, the lower surface of the conductive body 10 includes the third surface S3 that is linked to the first surface S1. The third surface S3 is oblique to the X-direction and the Z-direction. Therefore, the angle between the first surface S1 and the third surface S3 is less than 90 degrees. The electric field strength at the lower end vicinity of the conductive body 10 can be further reduced thereby. It is favorable for the angle between the first surface S1 and the third surface S3 to be greater than 30 degrees and less than 60 degrees.

As shown in FIG. 2, the conductive body 10 includes the first conductive part 11 and the second conductive part 12. The length of the first conductive part 11 is greater than the length of the second conductive part 12 in the X-direction. In other words, the lower end of the conductive body 10 bulges. According to this structure, similarly to the structure of the first to third surfaces S1 to S3, the electric field strength at the vicinity of the first conductive part 11 can be reduced.

It is favorable for the first conductive part 11 to include the void V as shown in FIGS. 1 and 2. Compared to when the void V is not provided, the conductive body 10 deforms more easily according to the stress of the insulating part 21 when the void V is provided. The stress of the insulating part 21 is reduced thereby. The stress that is applied from the insulating part 21 to the n⁻-type drift region 1 is reduced. As a result, the occurrence of crystal defects in the n⁻-type drift region 1 due to the stress can be suppressed.

It is favorable for the void V to extend in the Y-direction. In such a case, the volume of the void V is greater than when multiple voids V are interspersed along the Y-direction. The stress of the insulating part 21 is further reduced thereby.

In the semiconductor device 100, the bottom portion of the insulating part 21 is positioned between the conductive body 10 and the n⁻-type drift region 1 in the Z-direction. The side portion of the insulating part 21 is positioned between the conductive body 10 and the n⁻-type drift region 1 in the X-direction. According to the embodiment, a thickness T2a of the bottom portion of the insulating part 21 can be increased; and the difference between the thickness T2a and a thickness T1a of the side portion of the insulating part 21 can be reduced. As a result, the electric field strength at the insulating part 21 can be reduced, and the leakage current that flows through the insulating part 21 can be reduced.

The reason for the increase of the thickness T2a is considered to be as follows. When the insulating part 21 is formed, a large compressive stress is generated at the bottom portion of the insulating part 21. In the semiconductor device 100r shown in FIG. 7, the angle between the bottom surface BS and the side surface SS1 is substantially a right angle; and the compressive stress is not easily dispersed at the bottom portion of the insulating part 21. As a result, in the semiconductor device 100r, a thickness T2b of the bottom portion of the insulating part 21 is reduced, and the difference between the thickness T2b and a thickness T1b of the side portion of the insulating part 21 is increased. On the other hand, in the semiconductor device 100, the second surface S2 that is linked to the first surface S1 is oblique to the X-direction and the Z-direction. It is unlikely for the dispersion of the compressive stress to be inhibited by a right angle. As a result, the compressive stress of the bottom portion of the insulating part 21 is reduced, and the thickness T2a is increased.

In particular, for silicon oxide, the compressive stress in the [110] direction is less than the compressive stress in the [100] direction. When the insulating part 21 includes silicon oxide, a {110} plane of silicon oxide exists at the contact surface between the second surface S2 of the insulating part 21. The compressive stress at the portions contacting the second surface S2 of the insulating part 21 is reduced thereby. As a result, the compressive stress of the bottom portion of the insulating part 21 is more easily dispersed, and the thickness T2a is increased.

Modifications

Figure 9:
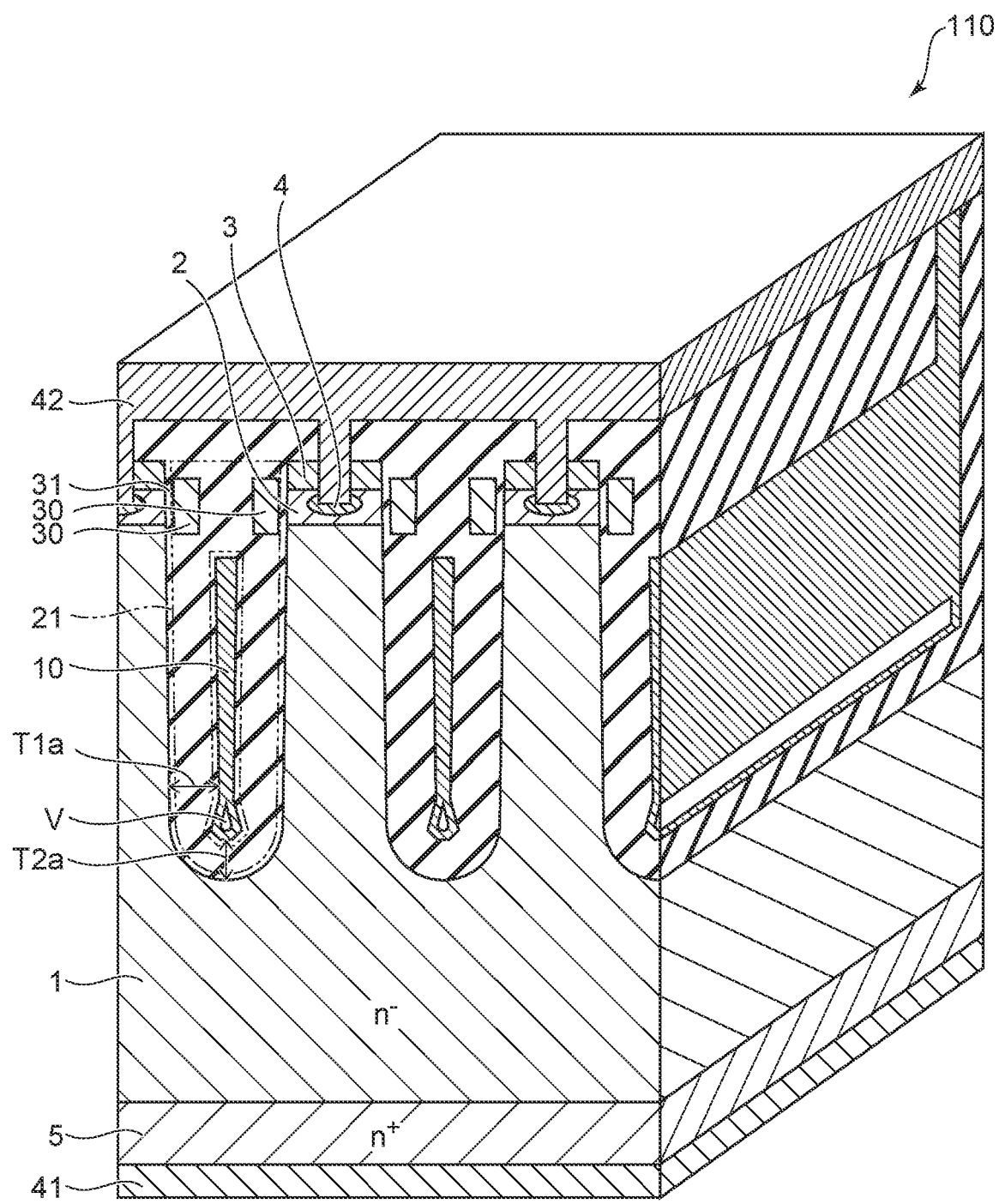
FIG. 9 is a perspective cross-sectional view showing portions of a semiconductor device according to the embodiment.
Figure 10:
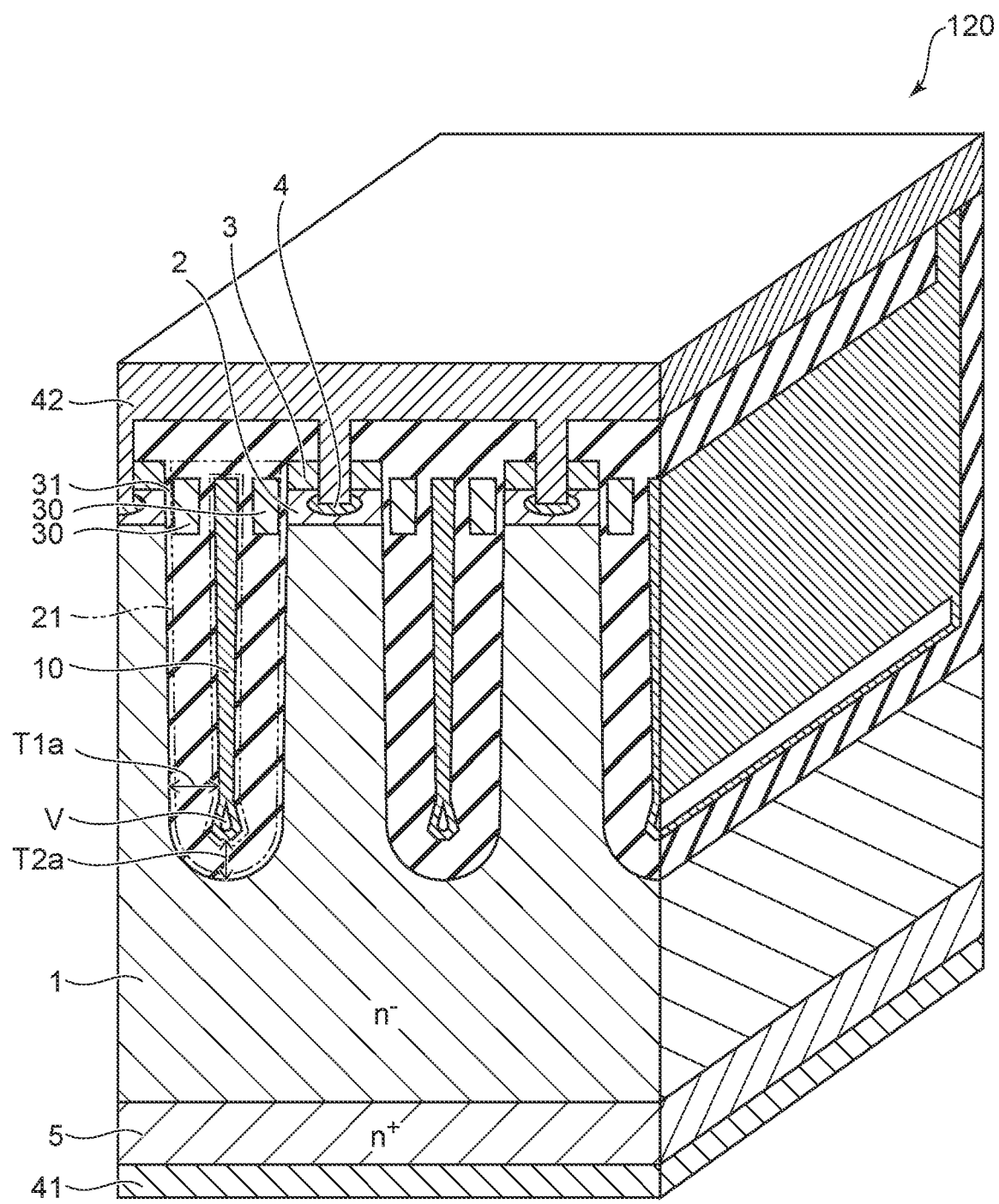
FIG. 10 is a perspective cross-sectional view showing portions of a semiconductor device according to the embodiment.

FIGS. 9 and 10 are perspective cross-sectional views showing portions of semiconductor devices according to embodiments.

The structures other than the lower end of the conductive body 10, namely the structures of the gate electrode 30, etc., are not limited to the example shown in FIG. 1 and are modifiable as appropriate. For example, as in a semiconductor device 110 shown in FIG. 9, multiple gate electrodes 30 may be located in one insulating part 21. In the illustrated example, a pair of gate electrodes 30 is located higher than the conductive body 10. The pair of gate electrodes 30 is apart from each other in the X-direction. When viewed along the Z-direction, the conductive body 10 is positioned between the pair of gate electrodes 30 in the X-direction.

Or, as in a semiconductor device 120 shown in FIG. 10, the upper portion of the conductive body 10 may be positioned between the pair of gate electrodes 30 in the X-direction.

In any embodiment, because the lower surface of the conductive body 10 includes the first to third surfaces S1 to S3, the flow of the leakage current in the insulating part 21 can be suppressed, and the breakdown voltage of the semiconductor device can be increased.

The specific shape of the lower surface of the conductive body 10 is not limited to the example described above. For example, the lower surface of the conductive body 10 may have a curved shape instead of the first surface S1, the second surface S2, and the third surface S3. In such a case as well, the electric field strength at the lower end vicinity of the conductive body 10 can be reduced.

In embodiments described above, the relative levels of the impurity concentrations between the semiconductor regions can be confirmed using, for example, a scanning capacitance microscope (SCM). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by secondary ion mass spectrometry (SIMS).

Electron backscatter diffraction (EBSD) can be used to analyze the crystal orientation of the insulating part 21 that contacts the lower surface of the conductive body 10. For example, the interface vicinity between the conductive body 10 and the insulating part 21 is analyzed by EBSD. When the lower surface of the conductive body 10 includes the first to third surfaces S1 to S3, the intensity of a peak corresponding to the {100} plane of silicon oxide is greater than the intensities of peaks corresponding to the other planes in the analysis results. When the lower surface of the conductive body 10 has a curved shape, multiple peaks that correspond respectively to multiple planes of silicon oxide appear in the analysis results.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
   a first electrode;
   a first semiconductor region located on the first electrode in a first direction and electrically connected with the first electrode, the first semiconductor region being of a first conductivity type;
   a second semiconductor region located on the first semiconductor region, the second semiconductor region being of a second conductivity type;
   a third semiconductor region located on a portion of the second semiconductor region, the third semiconductor region being of the first conductivity type;
   a conductive body located in the first semiconductor region with an insulating part interposed,
      the conductive body including a first conductive part and a second conductive part located on the first conductive part, a length of the first conductive part being greater than a length of the second conductive part in a second direction, the second direction being orthogonal to the first direction,
      the first conductive part including
         a first portion including a first surface and a second surface linked to the first surface, the first surface being parallel to the second direction, the second surface being oblique to the first and second directions, a second-direction length of the first portion increasing upward, and
         a second portion located on the first portion, a second-direction length of the second portion decreasing upward;
   a gate electrode located in the insulating part, the gate electrode facing the second semiconductor region via a gate insulating layer in the second direction; and
   a second electrode located on the second and third semiconductor regions, the second electrode being electrically connected with the second and third semiconductor regions.

2. The device according to claim 1, wherein
   the conductive body further includes a third conductive part located on the second conductive part, and
   the length of the second conductive part is less than a length of the third conductive part in the second direction.

3. The device according to claim 1, wherein
   a {100} plane of silicon oxide exists at a surface contacting the first surface of the insulating part, and
   a {110} plane of silicon oxide exists at a surface contacting the second surface of the insulating part.

4. The device according to claim 1, wherein
   a pair of the gate electrodes is located in the insulating part, and
   the pair of gate electrodes is apart from each other in the second direction.

5. The device according to claim 4, wherein
   a portion of the conductive body is located between the pair of gate electrodes in the second direction.

6. The device according to claim 1, wherein
   a lower end of the conductive body includes a void.

7. The device according to claim 6, wherein
   a distance in the first direction between the first electrode and the void is longer than a distance in the first direction between the first electrode and the gate electrode.

8. A semiconductor device, comprising:
   a first electrode;
   a first semiconductor region located on the first electrode in a first direction and electrically connected with the first electrode, the first semiconductor region being of a first conductivity type;
   a second semiconductor region located on the first semiconductor region, the second semiconductor region being of a second conductivity type;
   a third semiconductor region located on a portion of the second semiconductor region, the third semiconductor region being of the first conductivity type;
   a conductive body located in the first semiconductor region with an insulating part interposed,
      the conductive body including
         a first conductive part positioned at a lower end of the conductive body, and
         a second conductive part located on the first conductive part,
      the first conductive part being longer than the second conductive part in a second direction orthogonal to the first direction,
      a lower end of the conductivity body including a void;
   a gate electrode located in the insulating part, the gate electrode facing the second semiconductor region via a gate insulating layer in the second direction; and
   a second electrode located on the second and third semiconductor regions and electrically connected with the second and third semiconductor regions.

9. The device according to claim 8, wherein
   a pair of the gate electrodes is located in the insulating part, and
   the pair of gate electrodes is apart from each other in the second direction.

10. The device according to claim 9, wherein
a portion of the conductive body is located between the pair of gate electrodes in the second direction.

11. The device according to claim 8, wherein
a distance in the first direction between the first electrode and the void is longer than a distance in the first direction between the first electrode and the gate electrode.

12. A semiconductor device, comprising:
a first electrode;
a first semiconductor region located on the first electrode in a first direction and electrically connected with the first electrode, the first semiconductor region being of a first conductivity type;
a second semiconductor region located on the first semiconductor region, the second semiconductor region being of a second conductivity type;
a third semiconductor region located on a portion of the second semiconductor region, the third semiconductor region being of the first conductivity type;
a conductive body located in the first semiconductor region with an insulating part interposed, the conductive body including a first conductive part and a second conductive part located on the first conductive part, a length of the first conductive part is greater than a length of the second conductive part in the second direction, the second direction being orthogonal to the first direction,
the first conductive part including
a first surface parallel to the second direction, and
a second surface linked to the first surface, the second surface being oblique to the first and second directions, an angle between the first and second surfaces being greater than 90 degrees;
a gate electrode located in the insulating part, the gate electrode facing the second semiconductor region via a gate insulating layer in the second direction; and
a second electrode located on the second and third semiconductor regions, the second electrode being electrically connected with the second and third semiconductor regions.

13. The device according to claim 12, wherein
the conductive body further includes a third conductive part located on the second conductive part, and
the length of the second conductive part is less than a length of the third conductive part in the second direction.

14. The device according to claim 12, wherein
the first conductive part includes:
a first portion including the first and second surfaces, a second-direction length of the first portion increasing upward; and
a second portion located on the first portion, a second-direction length of the second portion decreasing upward.

15. The device according to claim 12, wherein
a {100} plane of silicon oxide exists at a surface contacting the first surface of the insulating part, and
a {110} plane of silicon oxide exists at a surface contacting the second surface of the insulating part.

16. The device according to claim 12, wherein
a pair of the gate electrodes is located in the insulating part, and
the pair of gate electrodes is apart from each other in the second direction.

17. The device according to claim 16, wherein
a portion of the conductive body is located between the pair of gate electrodes in the second direction.

18. The device according to claim 12, wherein
a lower end of the conductive body includes a void.

19. The device according to claim 18, wherein
a distance in the first direction between the first electrode and the void is longer than a distance in the first direction between the first electrode and the gate electrode.

* * * * *